US008292666B2

(12) United States Patent
Cheng et al.

(10) Patent No.: US 8,292,666 B2
(45) Date of Patent: Oct. 23, 2012

(54) SOCKET CONNECTOR WITH CONTACT TERMINALS ARRANGED RADIALLY CREATING DIFFERENT PITCHES IN DIFFERENT AREA

(75) Inventors: Chih-Pi Cheng, New Taipei (TW); Jia-Hau Liu, New Taipei (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/049,902

(22) Filed: Mar. 17, 2011

(65) Prior Publication Data

US 2011/0230100 A1    Sep. 22, 2011

(30) Foreign Application Priority Data

Mar. 17, 2010 (TW) ................................ 99107739 A

(51) Int. Cl.
*H01R 24/00* (2006.01)
(52) U.S. Cl. ...................................................... 439/626
(58) Field of Classification Search .................. 439/626, 439/625, 331, 66, 330, 296
See application file for complete search history.

(56) References Cited

U.S. PATENT DOCUMENTS

| | | | |
|---|---|---|---|
| 6,332,782 B1 | 12/2001 | Bezama et al. | |
| 6,459,039 B1 * | 10/2002 | Bezama et al. | 174/359 |
| 6,736,665 B2 * | 5/2004 | Zhou et al. | 439/482 |
| 6,981,881 B2 * | 1/2006 | Adachi et al. | 439/71 |
| 7,044,746 B2 * | 5/2006 | Copper et al. | 439/66 |
| 7,074,048 B2 | 7/2006 | Liao et al. | |
| 7,196,907 B2 * | 3/2007 | Zheng | 361/760 |
| 7,285,966 B2 * | 10/2007 | Lee et al. | 324/754.07 |
| 7,517,224 B2 * | 4/2009 | Fan et al. | 439/66 |
| 7,775,805 B2 * | 8/2010 | Liao et al. | 439/66 |
| 7,891,983 B2 * | 2/2011 | Ichimura et al. | 439/66 |
| 7,952,377 B2 * | 5/2011 | Kister | 324/762.01 |
| 8,074,354 B2 * | 12/2011 | Zheng | 29/882 |
| 2008/0050940 A1 * | 2/2008 | Lin et al. | 439/66 |
| 2009/0311900 A1 * | 12/2009 | Liao | 439/331 |
| 2009/0325415 A1 * | 12/2009 | Brist et al. | 439/330 |
| 2010/0227507 A1 * | 9/2010 | Cheng et al. | 439/626 |

FOREIGN PATENT DOCUMENTS

| | | |
|---|---|---|
| CN | 2702465 Y | 5/2005 |
| TW | M365569 | 9/2009 |

* cited by examiner

*Primary Examiner* — Alexander Gilman
(74) *Attorney, Agent, or Firm* — Wei Te Chung; Ming Chieh Chang

(57) ABSTRACT

An electrical connector includes an insulative housing defining a plurality of passageways and a plurality of contacts disposed in the passageways by two arrangement manners. Each contact includes a mating portion located at an upper end and a soldering portion located at a bottom end. Wherein a first arrangement manner is that neighboring mating portions defined a distance in a same row is smaller than a distance defined by corresponding neighboring soldering portions, and neighboring mating portions defined a distance in a same column is equal to a distance defined by corresponding neighboring soldering portions. A second arrangement manner is that neighboring mating portions defined a distance in both a same row and a same column is smaller than a distance defined by corresponding neighboring soldering portions.

20 Claims, 9 Drawing Sheets

SOCKET CONNECTOR WITH CONTACT TERMINALS ARRANGED RADIALLY CREATING DIFFERENT PITCHES IN DIFFERENT AREA

CROSS REFERENCE TO RELATED APPLICATIONS

This application is related to an U.S. patent application Ser. No. 12/983,829, filed Jan. 3, 2011 entitled "ELECTRICAL CONNECTOR CAPABLE OF INTERCONNECTING ELECTRONIC DEVICES HAVING DIFFERENT CONDUCTIVE LEADS ARRANGEMENTS" and which is assigned to the common assignee.

BACKGROUND OF THE INVENTION

1. Field of the invention

The present invention relates to an electrical connector, and more particularly to an electrical connector having contacts disposed radially for creating different pitches to interconnect an electronic package and a printed circuit board.

2. Description of Related Art

U.S. Pat. No. 7,044,746 issued to Copper et al. on May 16, 2006 discloses an electrical connector mounted on a printed circuit board for receiving an electronic package. As typically shown in FIGS. 1 and 3 of original disclosure, the electrical connector includes an insulative housing with a plurality of contacts received therein. The contacts are arranged in a matrix of high density, and each contact has two ends to respectively contact with a pad of the electronic package and another pad of the printed circuit board, so that the electrical connection between the electronic package and the printed circuit board is established. As a higher desire for the performance of the electronic package, the number of the pads of the electronic package and the contacts of the electrical connector are increased in the predefined area. However, as the number of the contacts of the electrical connector is increased, the risk of short circuit of neighboring contacts is substantially increased when the contacts are soldered onto the pads of the printed circuit board.

To overcome the above disadvantages, Taiwanese Utility Pat. No. M365569 issued to Cheng et al. on Sep. 21, 2009 discloses an improved electrical connector which has a plurality of contacts arranged in a matrix. Each contact has a slantwise neck above a soldering portion which is to be soldered on a printed circuit board. The angles of the necks relative to an imaginary plumb line vary in sequence, as can by typically see from FIG. 4 of original disclosure. For details disclosing the structure of the contacts, the necks at the opposite ends in a row have largest angles relative to the plumb line, and the part near the middle of the row tend to be vertical, so that the lower contact portions are uniformly arranged, while the pitch between any two neighboring soldering portion is larger than the pitch between corresponding two neighboring contact portions located at upper ends of the contacts. However, the contacts featured complicated structure and geometry, the production of the contact is complicated and the cost thereof is increased.

Therefore, an improved fine-pitch electrical connector is desired.

SUMMARY OF THE INVENTION

An object of the present invention is to provide an fine-pitch electrical connector having contacts disposed radially for creating different pitches to interconnect an electronic package and a printed circuit board.

According to one aspect of the present invention, there is provided an electrical connector which includes an insulative housing defining a plurality of passageways and a plurality of contacts disposed in the passageways by two arrangement manners. Each contact includes a mating portion located at an upper end and a soldering portion located at a bottom end. Wherein a first arrangement manner is that neighboring mating portions defined a distance in a same row is smaller than a distance defined by corresponding neighboring soldering portions, and neighboring mating portions defined a distance in a same column is equal to a distance defined by corresponding neighboring soldering portions. A second arrangement manner is that neighboring mating portions defined a distance in both a same row and a same column is smaller than a distance defined by corresponding neighboring soldering portions.

According to another aspect of the present invention, there is provided with an insulative housing for use with an electrical connector. The insulative housing defines a mating interface and a supporting interface with a plurality of passageways defined between the mating interface and the mounting interface. Each of the passageways defines at least a first inner wall and a second inner wall opposite to the first inner wall, wherein the second inner wall is angled to one of the mating and mounting interface, and the angle of each second inner wall increases as the passageways extend outward.

Other objects, advantages and novel features of the invention will become more apparent from the following detailed description of a preferred embodiment when taken in conjunction with the accompanying drawings.

DETAILED DESCRIPTION OF THE INVENTION

Figure 1:
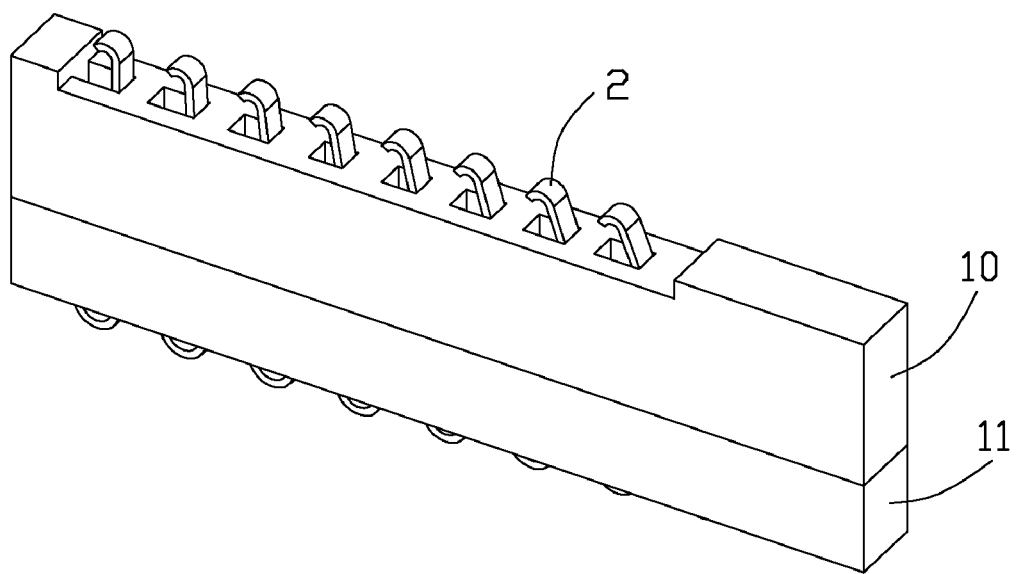
FIG. 1 is a perspective view of part of an electrical connector in accordance with the present invention, showing contacts received in an insulative housing in a first arrangement manner.

Referring to FIG. 1, an electrical contact is used to interconnect an electronic package (not shown) and a printed circuit board (not shown) and includes an insulative housing 1 and a plurality of contacts 2 arranged in the insulative housing 1.

Figure 2:
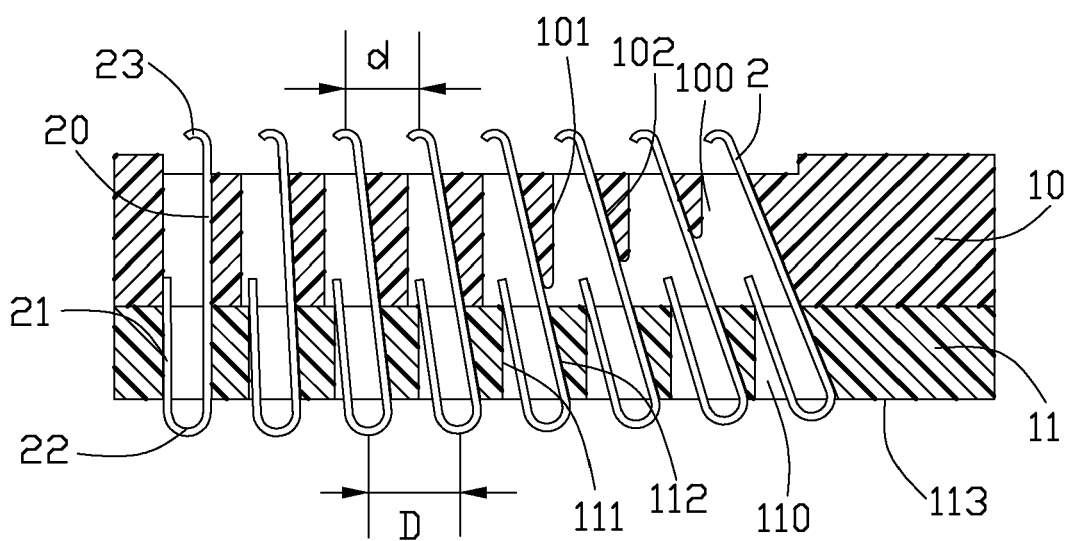
FIG. 2 is an exploded view of the electrical connector shown in FIG. 1.
Figure 7:
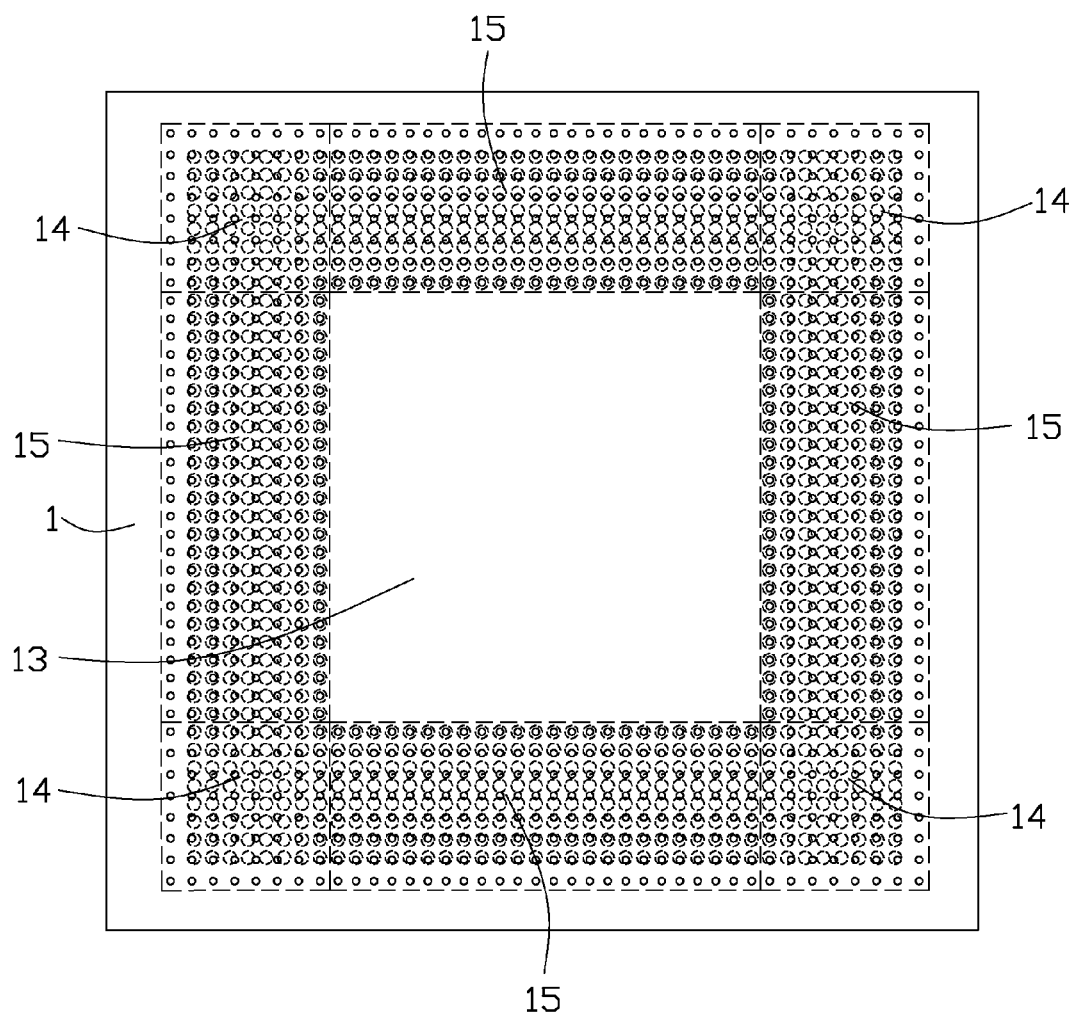
FIG. 7 is a first bottom view of relative positions of the mating portions and soldering portions, wherein the contact are illustrated by a pair of circles of different diameters.

Referring to FIGS. 2 and 7, the insulative housing 1 includes an upper housing 10 and a lower housing 11 positioned under the upper housing 10. The upper housing 10 defines a plurality of upper through holes 100, and the lower housing 11 defines a plurality of lower through holes 110. The upper through holes 100 and corresponding lower through holes 110 jointly constitute a passageway (not labeled) to receive the contacts 2, and some of the two neighboring passageways in a same row are communicated with each other. The insulative housing 1 is defined into a plurality of regions, which includes a center region 13 located at center of the insulative housing 1, four second regions 14 located at four corners of the insulative housing 1, and four first regions 15 defined between two neighboring second regions 14 and located at sides of the insulative housing 1. The contacts 2 are arranged an array configured by in a plurality of rows and a plurality of columns perpendicular to the rows, such as a matrix in each regions 13, 14, 15.

As shown in FIG. 2, the contacts 2 are assembled in the upper and the lower through holes 100, 110. Each contact 2 includes a spring arm 20 and a supporting arm 21 bent upwardly from the bottom of the spring arm 20. The spring arm 20 is substantially parallel to the supporting arm 21. The bent area between the spring arm 20 and the supporting arm 21 is formed with a soldering portion 22. The free end of the spring arm 20 is formed with a mating portion 23. The mating portions 23 extend beyond an upper surface of the upper housing 10 for electrically connecting with pads of the electronic package (not shown), and the soldering portions 22 extend beyond a bottom surface of the lower housing 11 for electrically connecting with pads of the printed circuit board (not shown).

Each of the upper through holes 100 of the upper housing 10 includes an upper vertical surface 101 and an upper abutting surface 102 opposite to the upper vertical surface 101. The lower through hole 110 of the lower housing 11 includes a corresponding lower vertical surface 111 and a lower abutting surface 112. Most of the upper vertical surfaces 101 are parallel to the corresponding lower vertical surfaces 111. The upper abutting surface 102 and corresponding lower abutting surface 112 are positioned coplanarly. When the contacts 2 are assembled in the passageway (not labeled), the supporting arms 21 abut on the corresponding lower vertical surfaces 101, the spring arms 20 engage with the corresponding upper and lower abutting surfaces 102,112 synchronously.

FIGS. 1 and 2 shows a set of contacts 2 arranged in a first arrangement manner. In the first arrangement manner, the contacts 2 in rows are respectively disposed at different angles relative to a bottom surface 113 of the insulative housing 1, wherein the contact 2 that located at a most-side end is vertical to the horizontal plane. The angles of the contacts 2 vary and become smaller and smaller in sequence from the contact 2 located vertically to the horizontal plane. The neighboring mating portions 23 in a same row define a distance d therebetween, and the corresponding neighboring soldering portions 22 define a distance D therebetween. According to above description of the structure of the contacts 2 assembling in the insulative housing 1, it can be readily recognized that the distance D is larger than the distance d, which is suitable for use between the electronic package (not shown) of fine-pitch and the printed circuit board (not shown) with larger pitch for avoiding circuit short.

Figure 3:
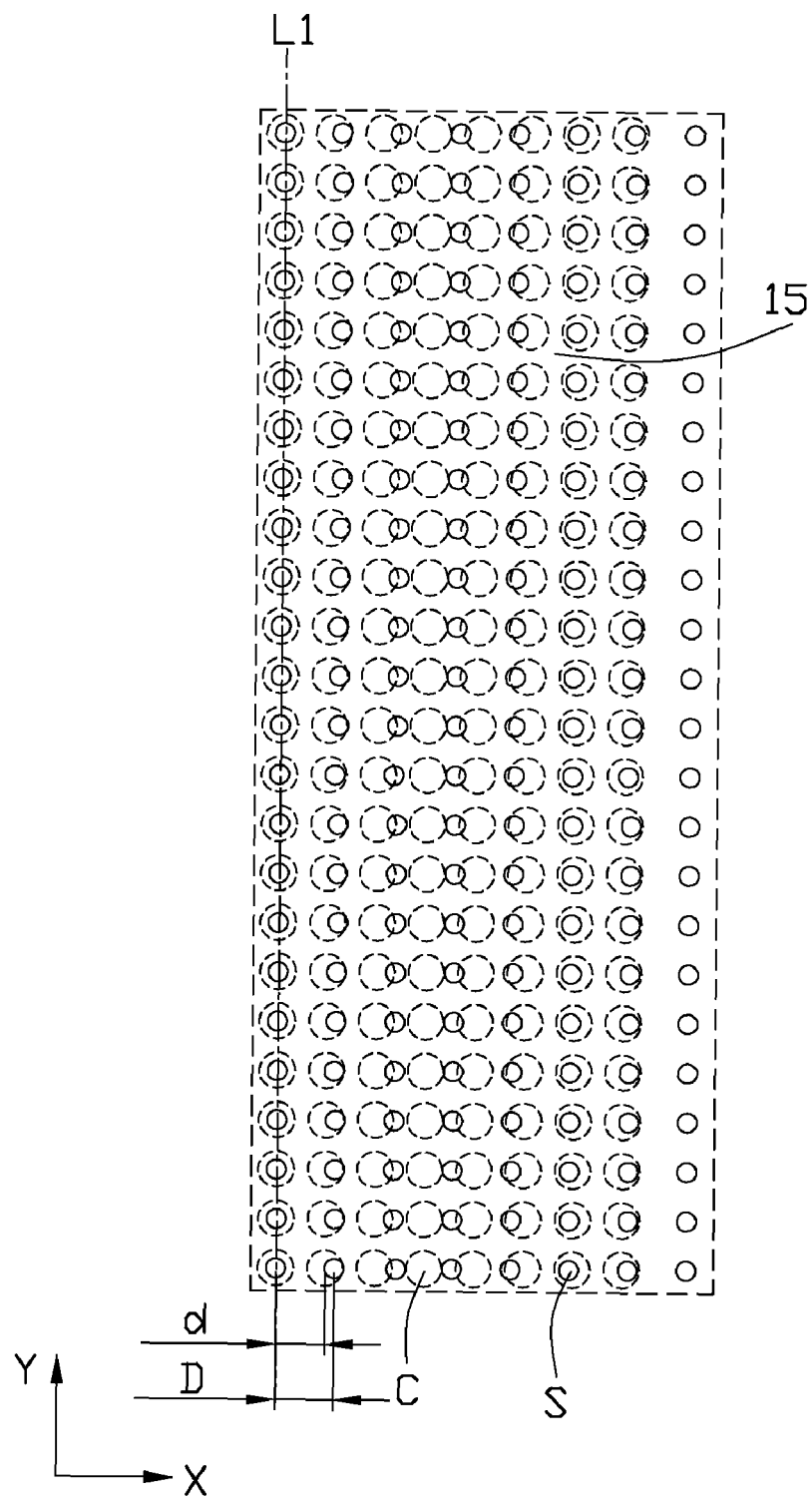
FIG. 3 is a bottom view of the contacts arranged in the insulative housing with the first arrangement manner, wherein the contact are illustrated by a pair of circles of different diameters.

FIG. 3 is a schematic drawing showing the first arrangement manner, wherein the dotted larger circle C represents the position of the mating portion 23, the solid smaller circle S represents the position of the soldering portion 22. It is clear that the distance d between to two neighboring circles C is smaller than the distance D between two neighboring circles S in X direction (extending along rows) and the distance between two neighboring circles C is equal to the distance between two neighboring circles S in Y direction (extending along columns), so an area defined by the mating portions 23 is smaller than another area defined by the soldering portions 22. In addition, the contacts 2 (each contact is illustrated by two circles of different diameters) showing in FIG. 3 can be symmetrically arranged on an axis L1 where the contacts 2 are disposed vertical to the bottom surface 113. According to above description, it is easy to understand that the first arrangement manner is, in fact, that the distance between neighboring soldering portions 22 of contacts 2 in a same row is larger than the corresponding distance between neighboring mating portions 23.

Figure 4:
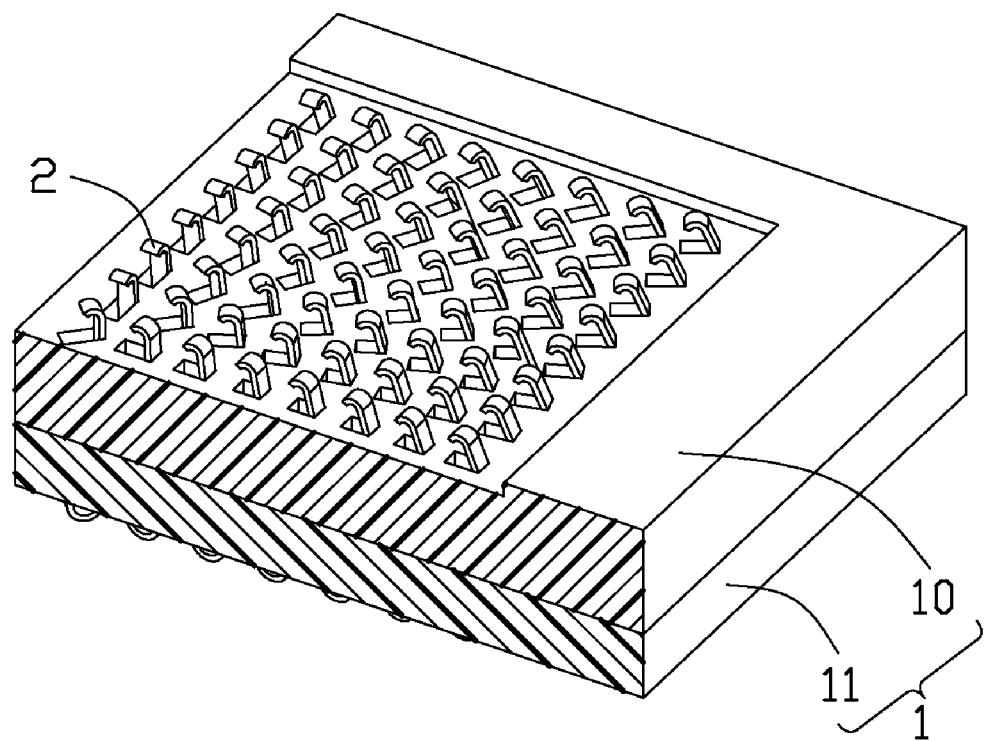
FIG. 4 is a perspective view of the contacts received in the insulative housing by a second arrangement manner.
Figure 5:
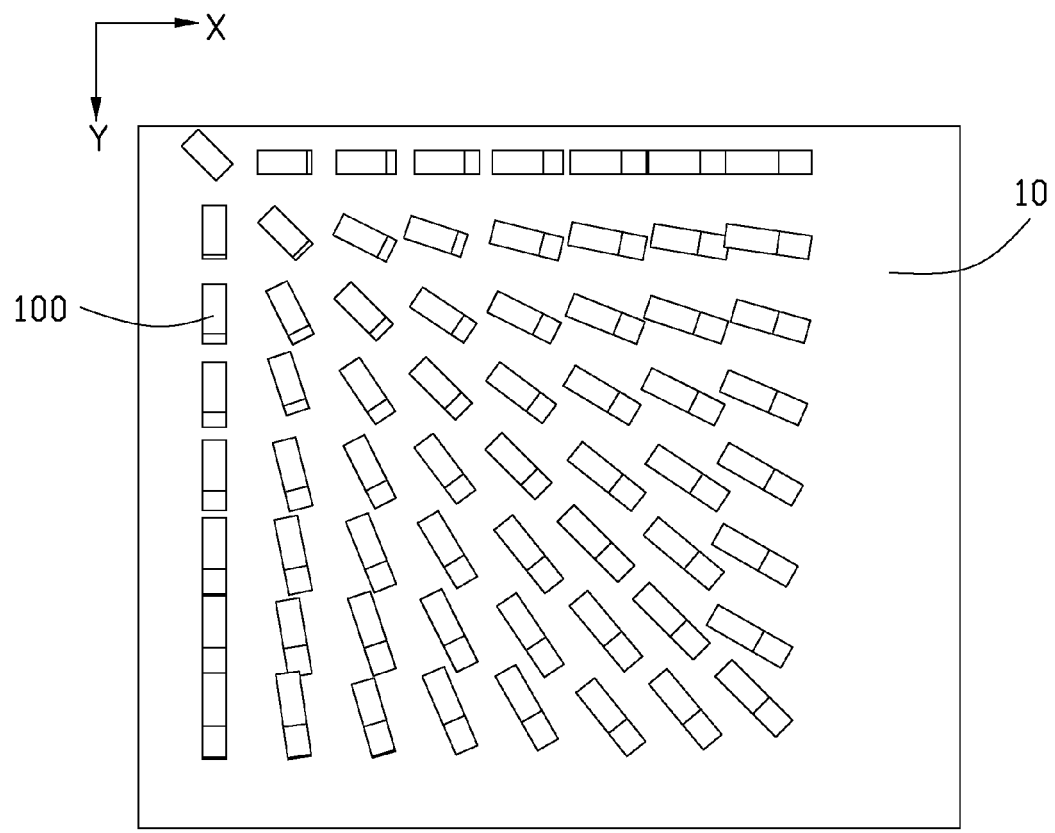
FIG. 5 is a bottom view of an upper housing in which the passageways are defined in the second arrangement manner.

FIGS. 4 and 5 shows a set of contacts 2 arranged in a second arrangement manner in which the distance between neighboring soldering portions 22 both in a same row and a same column is larger than the distance between corresponding neighboring mating portions 23, that because the contacts 2 in one most-side ends row are respectively disposed at different angles relative to an imaginary horizontal plane, and the contacts 2 in another row are disposed different with the most-side end row.

Figure 6:
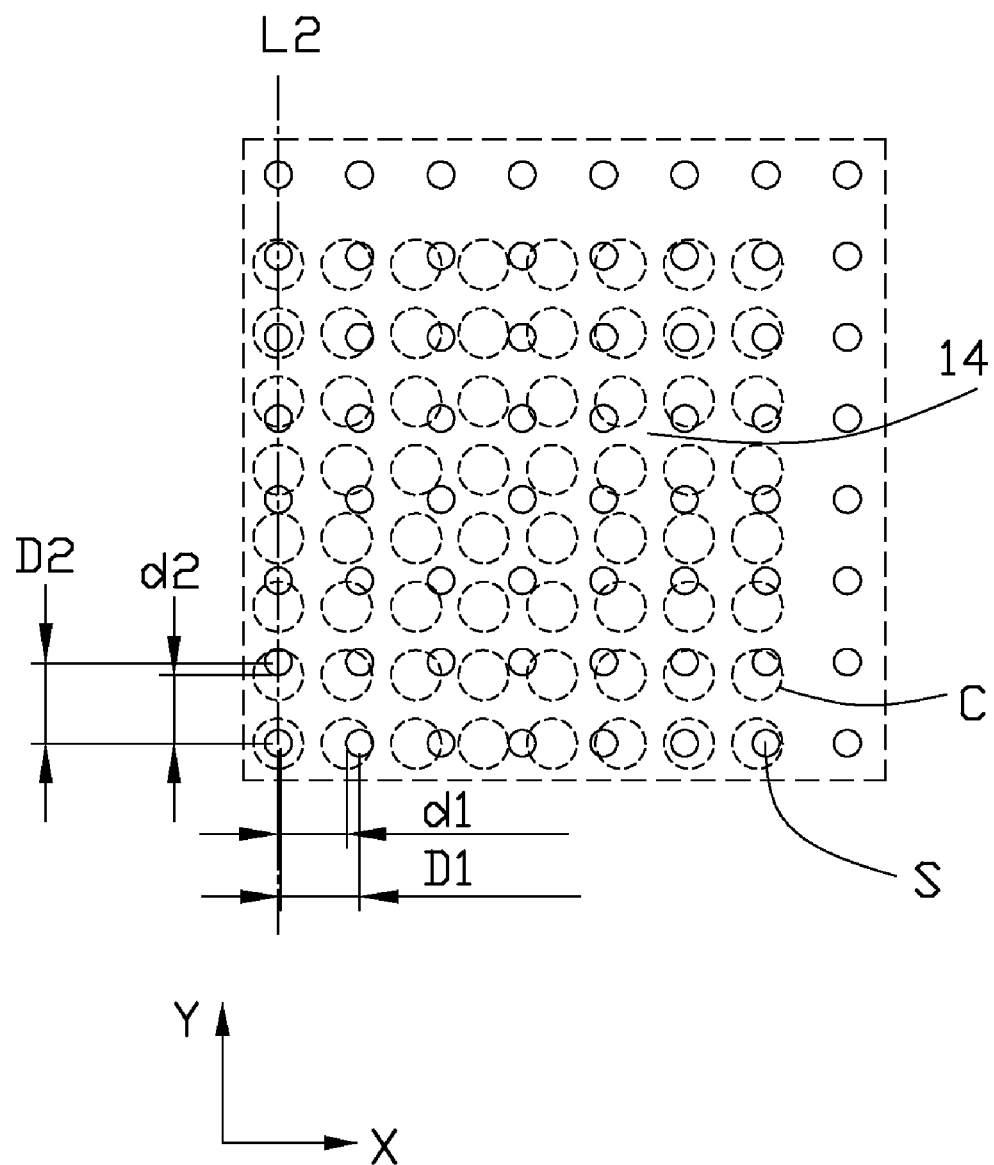
FIG. 6 is a bottom view of the contacts arranged in the insulative housing with the second arrangement manner, wherein the contact are illustrated by a pair of circles of different diameters.

FIG. 6 is a schematic drawing showing the second arrangement manner, wherein the distance d1 defined by two neighboring dotted circles C in a same row is smaller than the distance D1 defined by two corresponding neighboring solid circles S, and the distance d2 defined by two neighboring dotted circles C in a same column is smaller than the distance D2 defined by two corresponding two neighboring solid circles S, so the area defined by the mating portions 23 is larger than the another area defined by the soldering portions 22. Furthermore, the contacts 2 (each contact is illustrated by two circles of different diameters) showing in FIG. 6 can be also symmetrically arranged on an axis L2 where the contacts 2 are disposed in one of the two perpendicular most-side ends.

Figure 8:
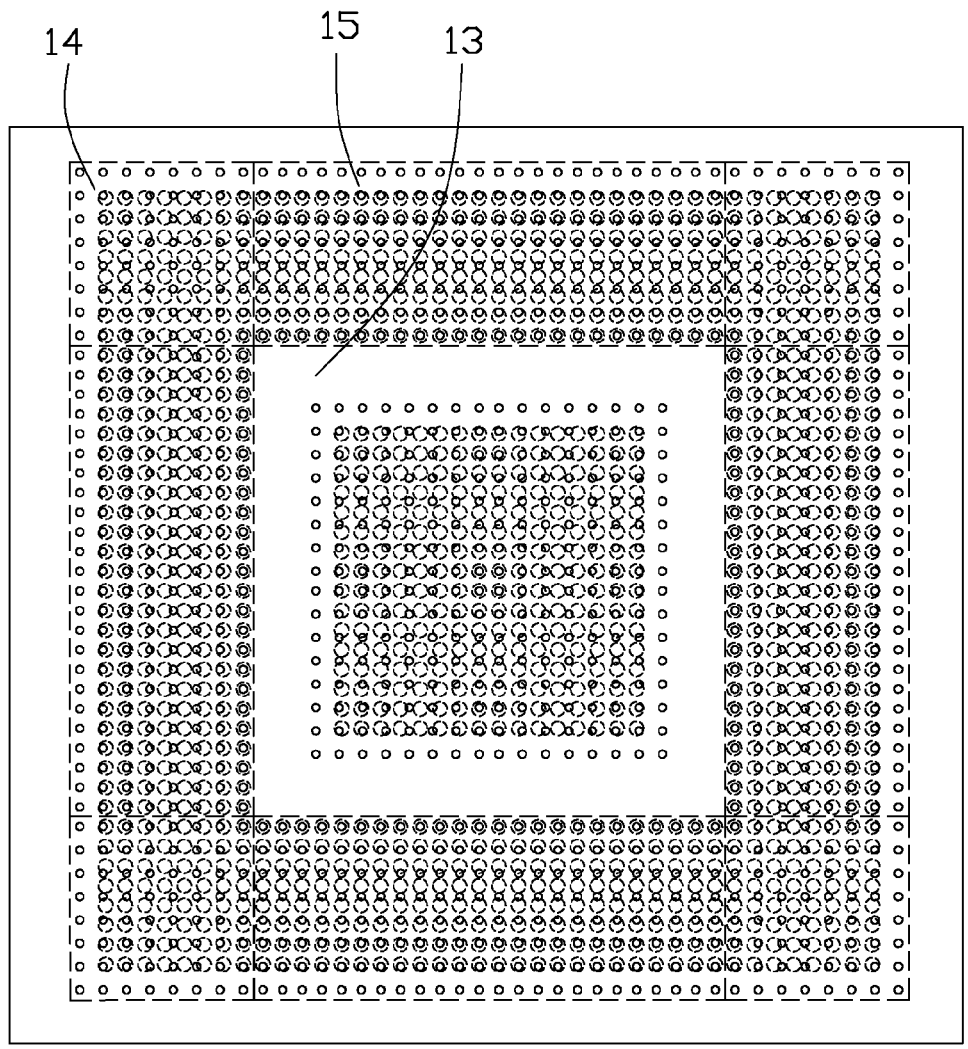
FIG. 8 is a second bottom view of relative positions of the mating portions and soldering portions, wherein the contact are illustrated by a pair of circles of different diameters.
Figure 9:
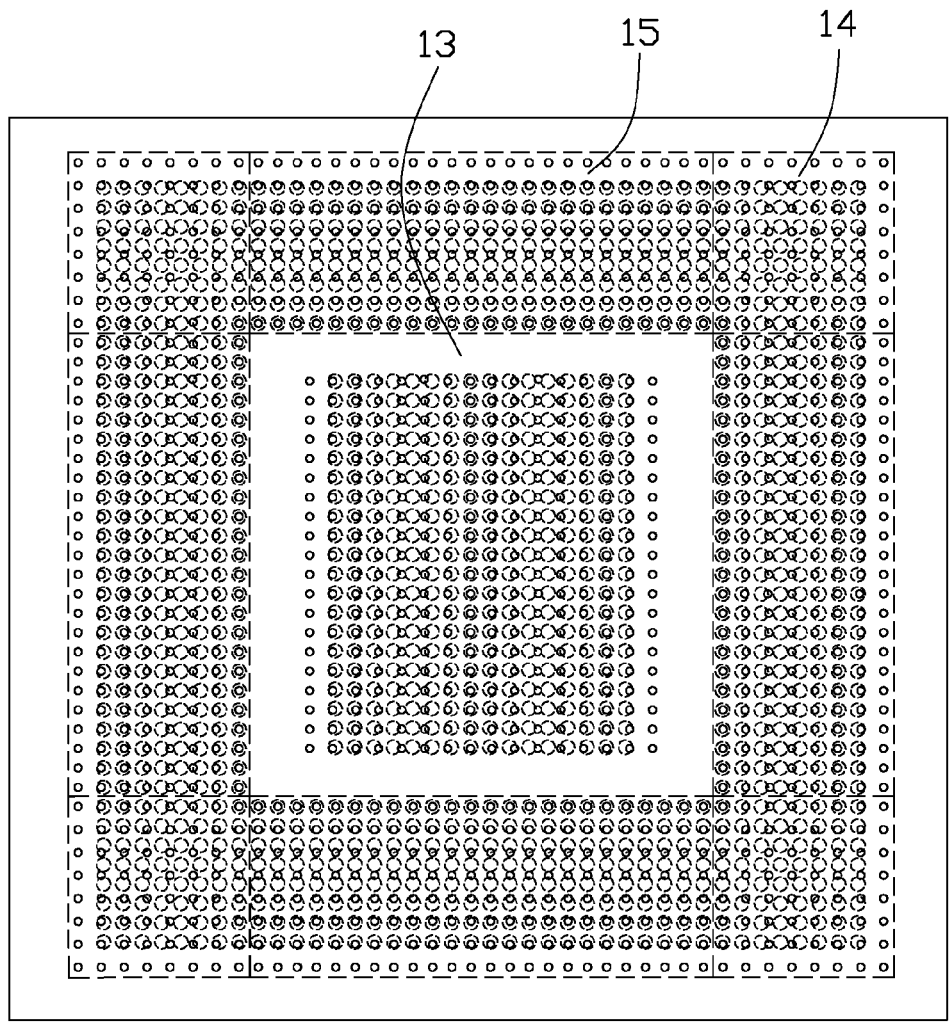
FIG. 9 is a third bottom view of relative positions of the mating portions and soldering portions, wherein the contact are illustrated by a pair of circles of different diameters.

Referring to FIGS. 3 and 6, whether the contacts 2 are arranged by the first arrangement manner or the second arrangement manner, the contacts 2 located at a most-side end with be restricted for the contacts 2 having bulky dimension, so there is a need to combine the first and the second arrangement manners. FIG. 7 shows that the contacts 2 arranged in the first arrangement manner combining with the second arrangement manner, wherein the contacts 2 in the second region 14 are arranged in the second arrangement manner, and the contacts 2 in the first region 15 are arranged in the first arrangement manner. Referring to FIGS. 8 and 9, to improve the utilization of the pads of the electronic package (not shown), the center region 13 of the insulative housing 1 can receive contacts 2 in the first arrangement manner or the second arrangement manner by mirror image.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:
1. An electrical connector comprising:
an insulative housing defining a plurality of passageways;
a plurality of contacts disposed in the passageways by two arrangement manners, and each contact including a mat- ing portion located at an upper end and a soldering portion located at a bottom end; and wherein a first arrangement manner is that neighboring mating portions in a same row defining a distance is smaller than a distance defined by corresponding neighboring soldering portions, and neighboring mating portions defining a distance in a same column is equal to a distance defined by corresponding neighboring soldering portions;

a second arrangement manner is that neighboring mating portions defined a distance in both a same row and a same column is smaller than a distance defined by corresponding neighboring soldering portions.

2. The electrical connector as claimed in claim 1, wherein each contact includes a spring arm, a supporting arm bent upwardly from the lower of the spring arm, and wherein the mating portion is formed on the spring arm and the soldering portion is formed at the bent area between the spring arm and the supporting arm.

3. The electrical connector as claimed in claim 2, wherein each passageway of the insulative housing includes an inclined abutting surface and a vertical surface perpendicular to a horizontal direction.

4. The electrical connector as claimed in claim 3, wherein the abutting surface engages with the spring arm and the vertical surface engages with the supporting arm.

5. The electrical connector as claimed in claim 1, wherein the insulative housing includes an upper housing defining a plurality of upper through holes and a lower housing defining a plurality of lower through holes, wherein the upper through hole and corresponding lower through hole communicate and jointly constitute the passageway.

6. The electrical connector as claimed in claim 5, wherein the upper through hole includes an upper vertical surface and an upper abutting surface, and the lower through hole includes a lower vertical surface and a lower abutting surface.

7. The electrical connector as claimed in claim 6, wherein the upper abutting surface and corresponding lower abutting surface are positioned coplanarly, and at least some of the upper vertical surfaces are parallel to the corresponding lower vertical surfaces.

8. The electrical connector as claimed in claim 1, wherein the insulative housing is defined into a plurality of regions, which includes a center region located at a center of the insulative housing, a plurality of second regions located at four corners of the insulative housing, and a plurality of first regions defined between the two neighboring second regions and located surrounding the center region.

9. The electrical connector as claimed in claim 8, wherein the contacts located in the first regions are disposed by the first arrangement manners, the contacts located in the second regions are disposed by the second arrangement manners, and the contacts located in the center region are disposed by the first or the second arrangement manners.

10. An insulative housing for use with an electrical connector, comprising:

an insulative base defining a mating interface and a supporting interface with a plurality of passageways defined between the mating interface and the mounting interface; and each of the passageways defining at least a first inner wall and a second inner wall opposite to the first inner wall, wherein the second inner wall is angled to one of the mating and mounting interface, and the angle of each second inner wall reduces as the passageways extend outward, and wherein some of the neighboring passageways in a same row are communicated with each other.

11. The insulative housing as claimed in claim 10, wherein the insulative housing includes an upper housing defining a plurality of upper through holes and a lower housing defining a plurality of lower through holes, wherein the upper through hole and corresponding lower through hole communicate and jointly constitute the passageway.

12. The insulative housing as claimed in claim 11, wherein the second inner wall of the upper housing and the corresponding second inner wall of the lower housing are positioned coplanarly, and at least some of the first inner wall of the upper housing are parallel to the corresponding first inner wall of the lower housing.

13. An electrical connector comprising:

an insulative housing defining horizontally a center region and a peripheral region wherein the peripheral region including a plurality of straight side regions and a plurality of corner regions alternate arranged with each other wherein the corner regions are located opposite to the center region in a diagonal manner, said housing further defining vertically opposite mating and mounting faces;

a plurality of contacts disposed in the housing with mating sections adjacent to the mating face and mounting sections adjacent the mounting face;

the contacts in each of the straight side regions oriented in a transverse direction perpendicular to a longitudinal direction defined by the corresponding straight side region while the contacts in each of the corner regions oriented in various oblique directions converged toward an innermost corner of said corner region.

14. The electrical connector as claimed in claim 13, wherein the center region is equipped with the contacts which are categorized with different sub-regions each arranged similar to those in the corresponding corner region which is closer thereto in the diagonal manner.

15. The electrical connector as claimed in claim 13, wherein the center region is equipped with the contacts which are categorized with different sub-regions each arranged similar to those in the neighboring straight side region in the transverse direction.

16. The electrical connector as claimed in claim 13, wherein an orientation of each of the contacts complies with pitch difference between the neighboring mating sections and the neighboring mounting sections.

17. The electrical connector as claimed in claim 16, wherein pitches of the mounting sections of the neighboring contacts gradually increase in a direction away from a center of the housing.

18. The electrical connector as claimed in claim 17, wherein the pitch variation occurs in the corresponding transverse direction for the contacts in each of the corresponding straight side region, and the pitch variation occurs in each of the corresponding various oblique directions for the contacts in each of the corresponding corner regions.

19. The electrical connector as claimed in claim 13, wherein the housing defines a plurality of passageways to receive the corresponding contacts therein, respectively, and each of most said passageways defines at least one oblique abutting surface for compliance with an obliquely extending spring arm of the corresponding contact.

20. The electrical connector as claimed in claim 19, wherein the housing is formed by an upper housing and a lower housing, and in each of said passageways an upper section is formed by the upper housing and a lower section is formed by the lower housing.

* * * * *